(12) United States Patent
Liu et al.

(10) Patent No.: US 11,162,982 B2
(45) Date of Patent: Nov. 2, 2021

(54) CURRENT DETECTION DEVICE

(71) Applicants: Kabushiki Kaisha Toshiba, Minato-ku (JP); Toshiba Electronic Devices & Storage Corporation, Minato-ku (JP)

(72) Inventors: Jia Liu, Yokohama (JP); Toshihiro Tsujimura, Ota (JP)

(73) Assignees: Kabushiki Kaisha Toshiba, Minato-ku (JP); Toshiba Electronic Devices & Storage Corporation, Minato-ku (JP)

( * ) Notice: Subject to any disclaimer, the term of this patent is extended or adjusted under 35 U.S.C. 154(b) by 72 days.

(21) Appl. No.: 16/566,395

(22) Filed: Sep. 10, 2019

(65) Prior Publication Data

US 2020/0174044 A1 Jun. 4, 2020

(30) Foreign Application Priority Data

Nov. 30, 2018 (JP) .............................. JP2018-225587

(51) Int. Cl.
*G01R 15/20* (2006.01)
*G01R 19/00* (2006.01)
*G01R 33/07* (2006.01)
*G01R 33/02* (2006.01)

(52) U.S. Cl.
CPC ....... *G01R 15/202* (2013.01); *G01R 19/0092* (2013.01); *G01R 33/02* (2013.01); *G01R 33/07* (2013.01)

(58) Field of Classification Search
CPC .. G01R 15/202; G01R 19/0092; G01R 33/07; G01R 33/02; G01R 33/072; G01R 33/0076; G01R 21/08

USPC .................................. 324/126, 207.2, 117 H
See application file for complete search history.

(56) References Cited

U.S. PATENT DOCUMENTS

| | | | | |
|---|---|---|---|---|
| 3,344,850 A * | 10/1967 | De Forest | ............ | G05D 23/275 165/256 |
| 6,879,145 B1 * | 4/2005 | Harris | ....................... | G01D 3/08 324/117 H |
| 7,372,261 B2 * | 5/2008 | Choi | ....................... | G01R 33/04 324/253 |
| 9,451,734 B2 * | 9/2016 | Onuma | ................ | H05K 9/0071 |

(Continued)

FOREIGN PATENT DOCUMENTS

JP 3206027 B2 9/2001
JP 2003014458 A * 1/2003

(Continued)

*Primary Examiner* — Tung X Nguyen
*Assistant Examiner* — Robert P Alejnikov, Jr.
(74) *Attorney, Agent, or Firm* — Oblon, McClelland, Maier & Neustadt, L.L.P.

(57) ABSTRACT

A current detection device includes a plane-shaped first coil pattern having a winding number of at least two or more, a magnetic field detection element isolated from the first coil pattern in a direction orthogonal to a plane of the first coil pattern, and arranged to receive a magnetic field formed by the first coil pattern, a driving circuit configured to drive the magnetic field detection element and output an output signal, a second coil pattern, a first substrate on the first coil pattern, a second substrate on the second coil pattern, and a third substrate on the magnetic field detection element. The magnetic field detection element is provided between the first coil pattern and the second coil pattern.

9 Claims, 5 Drawing Sheets

(56) References Cited

U.S. PATENT DOCUMENTS

| | | | |
|---|---|---|---|
| 10,670,671 B2* | 6/2020 | Ausserlechner | G01R 33/0094 |
| 2010/0097049 A1* | 4/2010 | Lepine | G01R 15/207 |
| | | | 324/117 H |
| 2010/0134101 A1* | 6/2010 | Riva | G01R 33/07 |
| | | | 324/251 |
| 2014/0210463 A1* | 7/2014 | Klein | G01R 33/05 |
| | | | 324/253 |
| 2015/0070007 A1* | 3/2015 | Kurniawan | G01R 35/00 |
| | | | 324/251 |
| 2015/0108967 A1* | 4/2015 | Barczyk | G01R 15/183 |
| | | | 324/202 |
| 2017/0108362 A1* | 4/2017 | Engel | G01R 33/1269 |
| 2017/0356949 A1* | 12/2017 | Tomkins | G01R 15/205 |
| 2018/0292469 A1* | 10/2018 | Hohe | G01R 33/0017 |
| 2019/0154864 A1* | 5/2019 | Hahn | G01R 33/0011 |
| 2019/0310325 A1* | 10/2019 | Leisenheimer | G01R 33/0017 |
| 2020/0124445 A1* | 4/2020 | Hahn | G01D 5/145 |
| 2020/0241083 A1* | 7/2020 | Franke | H01F 5/04 |
| 2021/0025959 A1* | 1/2021 | Yamamoto | G01D 5/20 |

FOREIGN PATENT DOCUMENTS

| | | |
|---|---|---|
| JP | 2010-271081 | 12/2010 |
| JP | 5316029 B2 | 10/2013 |

* cited by examiner

CURRENT DETECTION DEVICE

CROSS-REFERENCE TO RELATED APPLICATIONS

This application is based upon and claims the benefit of priority from the prior Japanese Patent Application No. 2018-225587 filed in Japan on Nov. 30, 2018; the entire contents of which are incorporated herein by reference.

FIELD

The present invention herein relates generally to a current detection device.

BACKGROUND

A current detection device detects a current by flowing a current to be detected through a coil, and detecting a magnetic field generated from the coil. The generated magnetic field is detected by, for example, a Hall element. When the magnetic field generated by the coil is small, in a conventional current detection device, an output voltage from a driving circuit of the Hall element is amplified by an amplification circuit, so as to detect a current.

However, an amplification factor of the amplification circuit is limited, and if the amplification factor of the amplification circuit is made too large, there is a risk that noises enter into the driving circuit of the Hall element and a performance of the current detection device is decreased.

DETAILED DESCRIPTION

A current detection device in an embodiment includes a plane-shaped first coil pattern having a winding number of at least two or more, a magnetic field detection element provided to be isolated from the first coil pattern in a direction orthogonal to a plane of the first coil pattern, and disposed to receive a magnetic field formed by the first coil pattern, and a driving circuit configured to drive the magnetic field detection element and output an output signal.

The embodiment is explained as follows, with reference to the drawings.

(Device Constitution)

Figure 1:
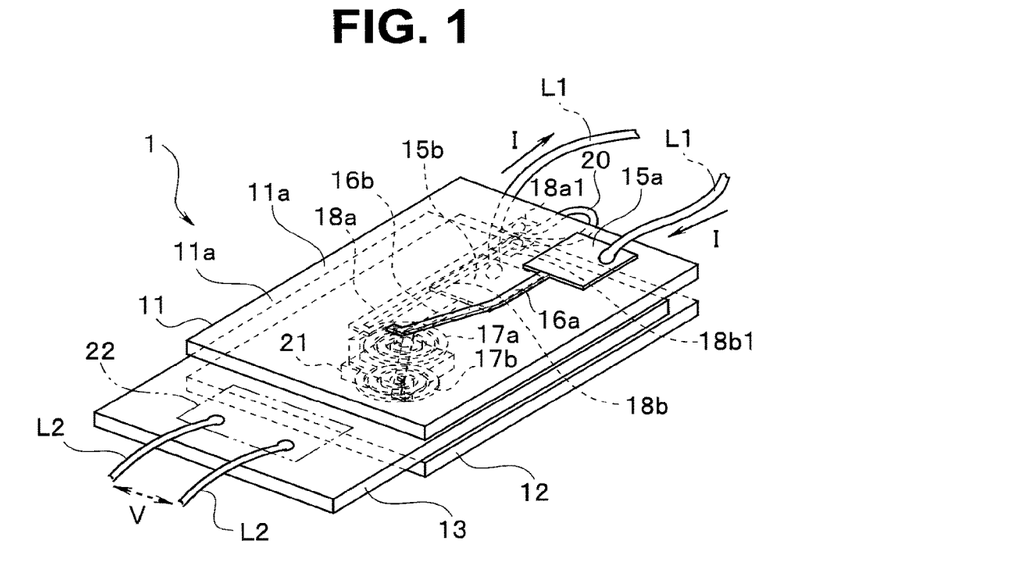
FIG. 1 is an entire constitution drawing of a current detection device in an embodiment.
Figure 2:
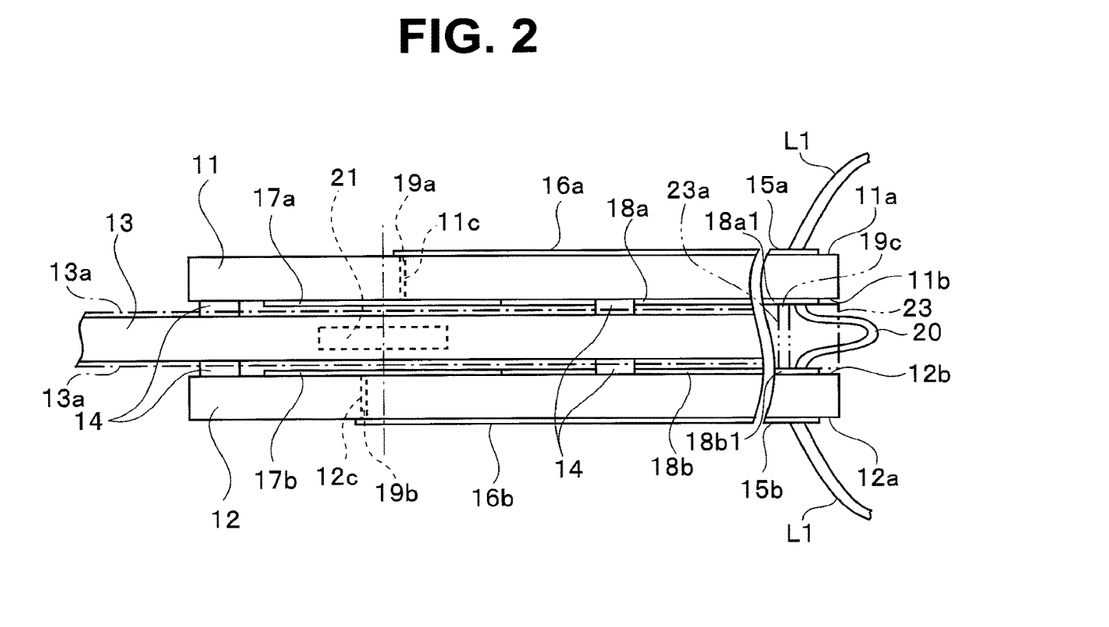
FIG. 2 is a side view of the current detection device in the embodiment.

FIG. 1 is an entire constitution drawing of a current detection device in an embodiment. FIG. 2 is a side view of the current detection device in the embodiment.

A current detection device 1 detects a current I flowing through a wiring L1. The detected current is a direct current or an alternating current. The current detection device 1 is constituted by attaching three substrates 11, 12, 13 each made of an insulation material to each other via plural spacer members 14. The three substrates are attached to each other such that the substrate 13 is arranged between the substrate 11 and the substrate 12. The current detection device 1 is used to protect from an excess current an AC/DC adapter, a control device in a general-purpose inverter or a motor variable speed apparatus, and a power module.

The substrate 11 has a rectangular shape, and has a top side flat face 11a, and a rear side flat face 11b. A pad 15a for connecting the wiring L1, and a wiring pattern 16a extending from the pad 15a are formed on the face 11a.

A spiral-shaped coil pattern 17a, and a wiring pattern 18a extending from an outer end of the coil pattern 17a are formed on the face 11b of the substrate 11 opposite to the face 11a. The wiring pattern 18a extends to the vicinity of an edge of the face 11b of the substrate 11.

A tip portion of the wiring pattern 16a on the face 11a of the substrate 11, and a tip portion on a center side of the coil pattern 17a on the face 11b are electrically connected to each other by a conductor 19a disposed in a contact hole (i.e., via hole) 11c penetrating through the substrate 11.

The substrate 11 and the substrate 13 are fixed by a fixing member (not shown) such as a screw via the plural spacer members 14 such that the face 11b of the substrate 11 and one face of the substrate 13 are opposite to each other.

The substrate 12 has a rectangular shape, and has a flat face 12a on a top side, and a flat face 12b on a rear side, as is similar to the substrate 11. A pad 15b for connecting the wiring L1, and a wiring pattern 16b extending from the pad 15b are formed on the face 12a.

Note that although each of the substrates 11, 12 has a rectangular shape here, each of the substrates 11, 12 may have other shapes such as a circular shape.

A spiral-shaped coil pattern 17b, and a wiring pattern 18b extending from an outer end of the coil pattern 17b are formed on the face 12b of the substrate 12 opposite to the face 12a. The wiring pattern 18b extends to the vicinity of the edge of the face 12b of the substrate 12.

A tip portion of the wiring pattern 16b on the face 12a of the substrate 12, and a tip portion on the center side of the coil pattern 17b on the face 12b are electrically connected to each other by a conductor 19b disposed in a contact hole (i.e., via hole) 12c penetrating through the substrate 12.

The substrate 12 and the substrate 13 are fixed by a fixing member (not shown) such as a screw via the plural spacer members 14 such that the face 12b of the substrate 12 and the other face of the substrate 13 are opposite to each other.

A tip portion of the wiring pattern 18a is connected to a pad 18a1 formed at the edge of the face 11b of the substrate 11. A tip portion of the wiring pattern 18b is connected to a pad 18b1 formed at an edge of the face 12b of the substrate 12. The pads 18a1 and 18b1 are connected to each other by a wiring 20. Therefore, the current to be detected flows through the two coil patterns 17a and 17b.

Note that shield layers 13a, 13b shown by dot lines are provided on both faces of the substrate 13, so as to shield electromagnetic noise from entering into a driving circuit 22 of a Hall element 21. The shield layers 13a and 13b are sheet members of a conductive material such as aluminum.

The Hall element 21 as a magnetic sensor is embedded in the substrate 13. The substrates 11, 12, 13 are attached and fixed to each other such that the Hall element 21 is positioned between the two coil patterns 17a and 17b. The Hall element 21, which is a magnetic field detection element, generates an electromotive force in proportion to a magnetic flux density, and outputs voltage signals according to an electromotive current.

In other word, each of the two coil patterns 17a and 17b is a plane coil having a spiral shape. The Hall element 21 is provided to be isolated from each of the coil patterns 17a and 17b, and is disposed to receive the magnetic field formed by each of the coil patterns 17a, 17b when the current flows through the two coil patterns 17a and 17b.

The output signals of the Hall element 21 are amplified by the driving circuit 22 including the amplification circuit formed on the substrate 13. A voltage V according to a current I appears between two output terminals of the driving circuit 22. Accordingly, the voltage V generated between two wirings L2 connected to two output terminals of the driving circuit 22 becomes a voltage according to a current value of the current I. In other words, the driving circuit 22 drives the Hall element 21, and outputs output signals of the Hall element 21 that is a magnetic field detection element. The output signals of the driving circuit 22 have a voltage value according to an electromotive force generated on the Hall element 21.

Note that in the above-mentioned example, although the coil patterns 17a and 17b are connected by the wiring 20, as shown by two-dot chain lines in FIG. 2, the coil patterns 17a and 17b may be electrically connected by a conductor 19c disposed in a contact hole 23a penetrating through a substrate 23, by tightly disposing between the substrates 11 and 12 the substrate 23 made of an insulation material.

Furthermore, in the above-mentioned example, the current detection device 1 is formed by attaching the three substrates 11, 12 and 13 to each other. The current detection device 1 may be configured as one semiconductor device by forming each substrate as an insulation layer, arranging a magnetic sensor in one insulation layer, forming the coil patterns 17a, 17b, respective wiring patterns 16a, 16b, 18a, 18b and the like on plural insulation layers, and forming conductors 19a, 19b in the contact hole on the insulation layers.

(Configuration of Coil Pattern)

Figure 3:
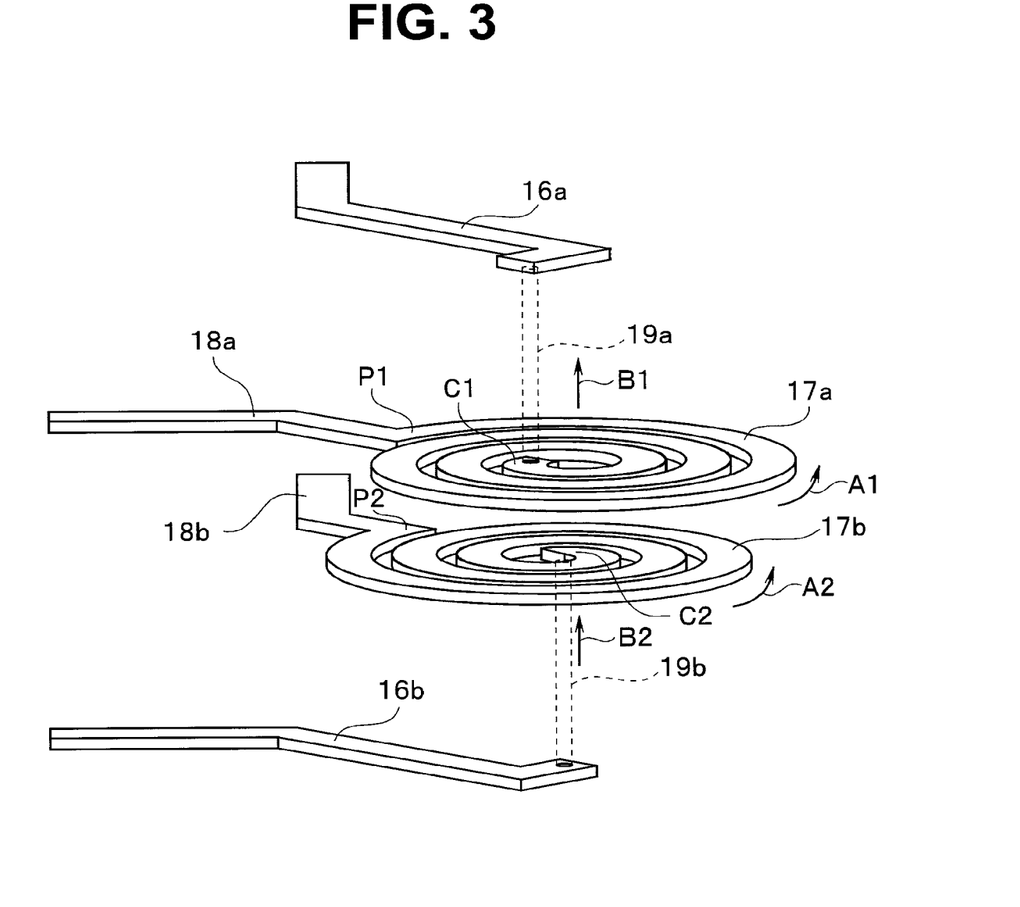
FIG. 3 is a perspective view for explaining arrangement of two coil patterns of the current detection device in the embodiment.

FIG. 3 is a perspective view for explaining arrangement of the two coil patterns 17a and 17b of the current detection device. FIG. 3 is a perspective view of the four wiring patterns 16a, 16b, 18a, 18b and the two coil patterns 17a, 17b of the current detection device 1.

Each of the coil patterns 17a, 17b forms a plane coil formed into a spiral shape. Each of the coil patterns 17a, 17b is a flat-shaped coil having at least two windings.

The two coil patterns 17a, 17b are arranged such that the face 11b of the substrate 11, on which the coil pattern 17a is provided, and the face 12b of the substrate 12, on which the coil pattern 17b is provided, are opposite and in parallel to each other.

When seeing the coil patterns 17a, 17b from a plane view, each of the coil patterns 17a, 17b has a constant space between two patterns adjacent to each other in a spiral. Furthermore, when seeing the coil patterns 17a, 17b from a plane view, pattern width of each of the coil patterns 17a, 17b is also constant. In other words, the pattern width (i.e., line) of each of the coil patterns 17a, 17b and a distance (space) between the patterns are constant.

Here, the current I from a pad 15a is supplied to a center end C1 of the coil pattern 17a via the conductor 19a. In other words, as described above, an end on a center side of the coil pattern 17a is electrically connected to the wiring pattern 16a through which the current to be detected flows, via the conductor 19a provided in the contact hole 11c formed on the substrate 11 that is an insulation layer.

The coil pattern 17a is wound counterclockwise when seen from a top in FIG. 3, and therefore, the current I flows toward an outer peripheral end P1 of the coil pattern 17a in a direction shown by an arrow A1. The current I is supplied from the outer peripheral end P1 to an outer peripheral end P2 of the coil pattern 17b through the wiring pattern 18a, the wiring 20 and the wiring pattern 18b.

The coil pattern 17b is wound clockwise when seen from a top in FIG. 3, and therefore, the current I flows toward a center end C2 of the coil pattern 17b in a direction shown by an arrow A2. As a result, a direction B1 of a magnetic field generated by the coil pattern 17a is identical to a direction B2 of a magnetic field generated by the coil pattern 17b.

Here, the current I from the center end C2 of the coil pattern 17b is supplied to the wiring pattern 16b via the conductor 19b. In other words, as described above, the end on the center side of the coil pattern 17b is electrically connected to the wiring pattern 16b through which the current to be detected flows, by the conductor 19b provided in the contact hole 12c formed on the substrate 12 that is an insulation layer.

Figure 4:
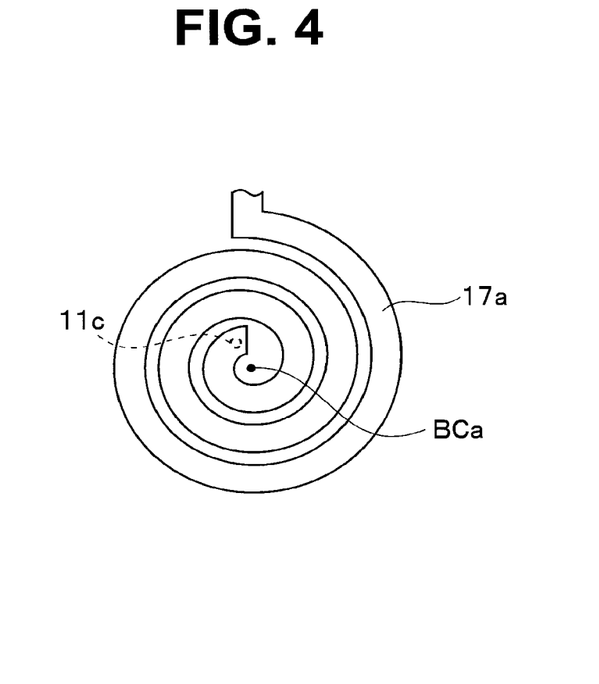
FIG. 4 is a plane view of one coil pattern when seen from a surface side of one of two substrates in the embodiment.
Figure 5:
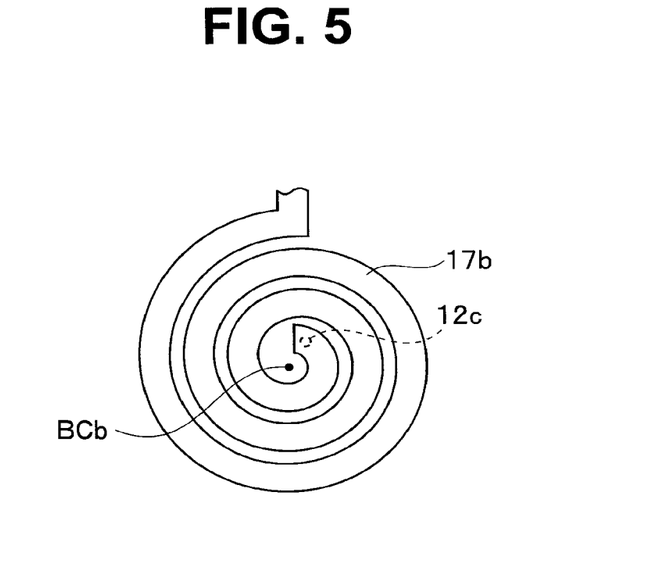
FIG. 5 is a plane view of the other coil pattern when seen from a face side on a rear face of the other of the two substrates in the embodiment.

FIG. 4 is a plane view of the coil pattern 17a when seen from a surface side of one substrate 11 of the two substrates 11 and 12. FIG. 5 is a plane view of the coil pattern 17b when seen from a face 12b side that is a rear face of the other substrate 12 of the two substrates 11 and 12.

Here, as described above, the coil patterns 17a, 17b have such a spiral shape that pattern width (i.e., line) and a gap (space) between the patterns is constant. The coil pattern 17a is formed on the substrate 11, the coil pattern 17b is formed on the substrate 12, and the Hall element 21 is provided on the substrate 13. Then, the coil patterns 17a and 17b are electrically connected to each other such that a magnetic flux direction when the current flows through the coil pattern 17a coincides with a magnetic flux direction when the current flows through the coil pattern 17b.

In FIG. 4, a point BCa is a center point of a magnetic flux generated by the current flowing through the coil pattern 17a. At the point BCa, a density of the magnetic flux is highest due to the current flowing through the coil pattern 17a.

Similarly, in FIG. 5, a point BCb is a center point of a magnetic flux generated by the current flowing through the coil pattern 17b. At the point BCb, a density of the magnetic flux is highest due to the current flowing through the coil pattern 17b.

In other words, a center shaft of the magnetic flux generated by the coil pattern 17a (passing through the point BCa), and a center shaft of the magnetic flux generated by the coil pattern 17b (passing through the point BCb) are positioned on the same shaft. Then, the Hall element 21 is disposed between the two coil patterns 17a, 17b and on the same shaft as two center shafts.

Therefore, the center of the Hall element 21 passes through the points BCa and BCb such that the Hall element 21 receives the largest amount of the magnetic flux generated by the coil patterns 17a and 17b. The Hall element 21 is disposed on the coil patterns 17a and 17b such that the Hall element 21 is on a segment orthogonal to planes of the coil patterns 17a and 17b serving as plane coils respectively.

When seen from a face 11a side of the substrate 11, the contact hole 11c is formed on the substrate 11 such that the contact hole 11c is disposed on a position displaced from the point BCa, as shown in FIG. 4. Similarly, when seen from a face 12b side of the substrate 12, the contact hole 12c is formed on the substrate 12 such that the contact hole 12c is disposed on a position displaced from the point BCb, as shown in FIG. 5. This is to prevent the magnetic flux from passing in the conductors in the contact holes 11c, 12c and deteriorating the density of the magnetic flux.

Figure 6:
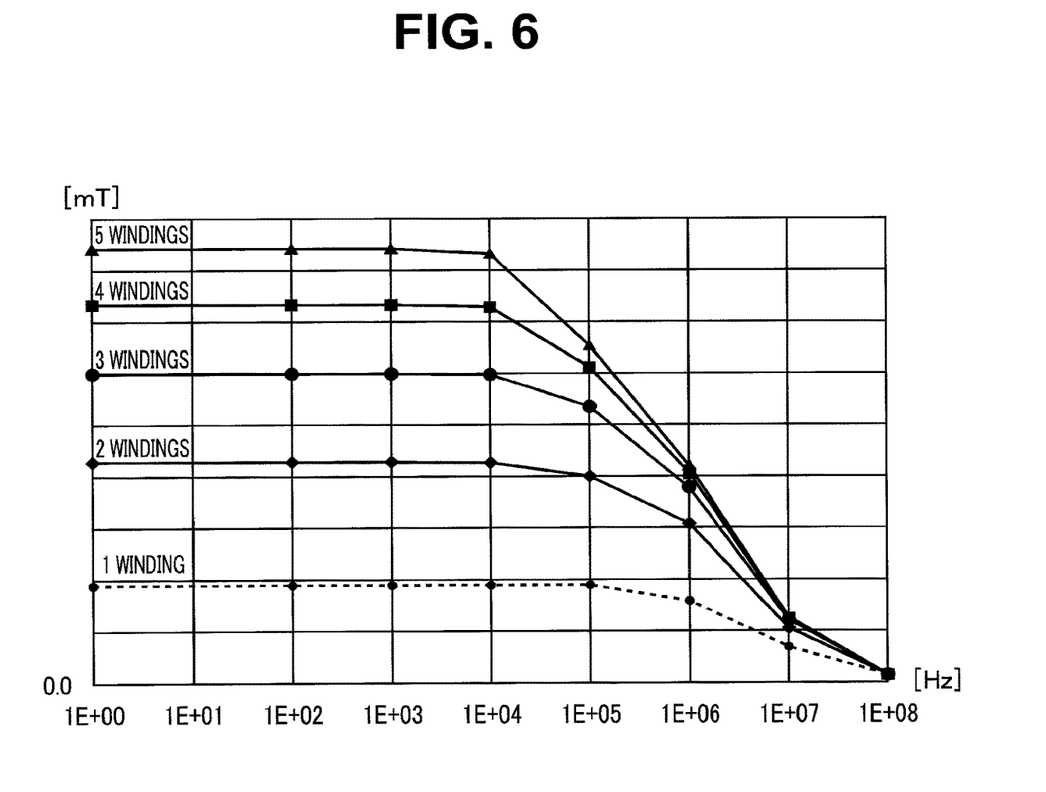
FIG. 6 is a graph showing a relationship between a frequency of an alternating current flowing through two coil patterns and a magnetic flux density of generated magnetic field in the embodiment.

FIG. 6 is a graph showing a relationship between a frequency of an alternating current flowing through the above-mentioned two coil patterns 17a, 17b, and a magnetic flux density of the generated magnetic field. FIG. 6 shows variations of the magnetic flux density in five cases where the winding numbers of the respective coil patterns 17a, 17b are one, two, three, four and five.

A horizontal axis of FIG. 6 is a frequency of the current flowing through the two coil patterns 17a, 17b, and a vertical axis is the density of the magnetic flux generated by the two coil patterns 17a, 17b. When the winding number of each of the coil patterns 17a, 17b is two or more, the density of the generated magnetic flux becomes two or more times, compared to a conventional case where the winding number is one.

As shown in FIG. 6, when the frequency of the detected current is low, the density of the magnetic flux generated by the two coil patterns 17a, 17b becomes high corresponding to the winding number of the coil patterns 17a, 17b. However, when the frequency of the detected current becomes high, the density of the generated magnetic flux does not increase in proportion to the winding number of the coil pattern.

For example, in FIG. 6, when the frequency exceeds 100 KHz, the density of the generated magnetic flux when the winding number of the coil patterns 17a, 17b is three is not significantly different from the density of the generated magnetic flux when the winding number is five.

When the winding number of the coil patterns 17a, 17b becomes large, a size of the current detection device 1 also becomes large, but the density of the generated magnetic flux does not become high even when the winding number is made large, if the frequency of the current becomes high. Accordingly, a designer of the current detection device 1 can set the winding number of each of the coil patterns 17a, 17b in light of constraint of the size required for the current detection device 1.

As described above, each of the coil patterns 17a, 17b has a winding number of at least two or more such that the magnetic flux density of the magnetic field given to the Hall element 21 can be increased. Furthermore, the plane coil the winding number of which is appropriate can be made according to the frequency of the current, and therefore, the designer can design the current detection device 1 in such a manner that the size of the device does not become larger than necessary.

Accordingly, in the above-mentioned embodiment, the current detection device that can increase the magnetic field generated on the coil can be provided.

Then, variation of the above-mentioned embodiment will be explained.

(Variation 1)

Note that in the above-mentioned embodiment, the coil patterns 17a, 17b are provided on the face 11b, which is a rear face of the substrate 11, and the face 12b, which is a rear face of the substrate 12, such that the coil patterns 17a, 17b are positioned near the Hall element 21. However, the coil patterns 17a, 17b may be provided on the face 11a that is a top face of the substrate 11 and the face 12a that is a top face of the substrate 12.

Otherwise, one of the two coil patterns 17a, 17b may be provided on the rear face of one of the substrates 11, 12, and the other may be provided on the top face of the other of the substrates 11, 12.

(Variation 2)

In the above-mentioned embodiment, in the two coil patterns 17a, 17b sandwiching the Hall element 21, the winding number of the coil patterns 17a and the winding number of the coil pattern 17b are both three, but at least one of the two coil patterns 17a, 17b may have the winding number of two or more.

Therefore, for example, one of the two coil patterns 17a, 17b may have one winding and the other of the two coil patterns 17a, 17b may have two or more windings.

Otherwise, one of the two coil patterns 17a, 17b may have two windings and the other of the two coil patterns 17a, 17b may have three windings, or one of the two coil patterns 17a, 17b may have three windings and the other of the two coil patterns 17a, 17b may have four windings.

(Variation 3)

In the above-mentioned embodiment, each of the coil patterns 17a, 17b has a spiral shape such that the interval of the adjacent coil patterns is equal, but may have a coil shape such as a hyperbolic spiral shape or a logarithmic spiral shape formed on a two-dimensional plane.

Figure 7:
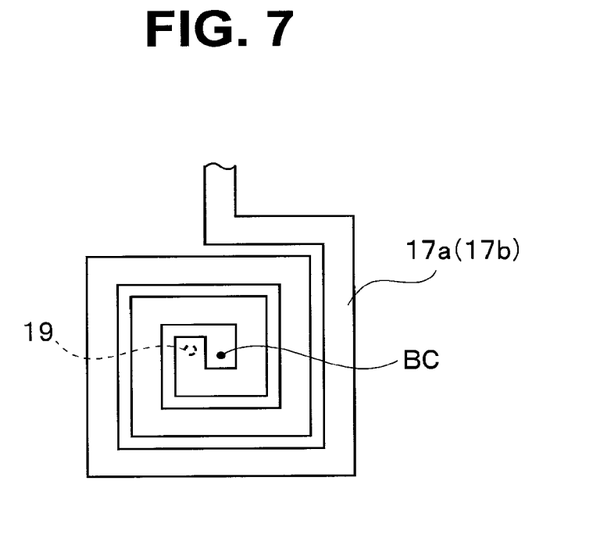
FIG. 7 is a plane view of a plane coil each coil pattern of which has a rectangular shape in variation 3 of the embodiment.
Figure 8:
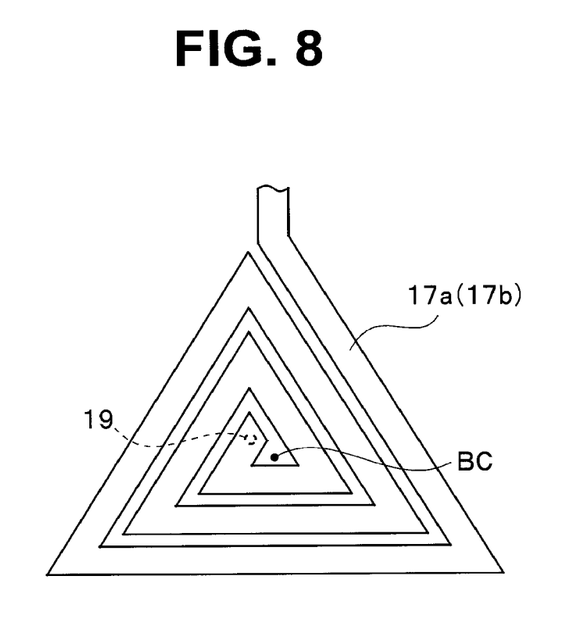
FIG. 8 is a plane view of a plane coil each coil pattern of which has a triangle shape in variation 3 of the embodiment.

Furthermore, each of the coil patterns 17a, 17b may have a shape as shown in FIG. 7 or FIG. 8.

FIG. 7 is a plane view of a plane coil each coil pattern of which has a rectangular shape. As shown in FIG. 7, each of the coil patterns 17a, 17b is a plane coil of three windings that is entirely formed into a rectangular shape by connecting straight lines, not curving lines.

FIG. 8 is a plane view of a plane coil each coil pattern of which has a triangle shape. Each of the coil patterns 17a, 17b shown in FIG. 8 is a plane coil of three windings that is entirely formed into a triangle shape by connecting straight lines, not curving lines.

In the coil patterns shown in FIG. 7 and FIG. 8, the position of the center point BC of the magnetic flux generated by the current flowing through each of the coil patterns 17a, 17b is slightly displaced from the position of the conductor 19 arranged in the contact hole formed on the substrates 11, 12, when each of the coil patterns 17a, 17b is seen from a plane view.

(Variation 4)

In the above-mentioned embodiment, the two coil patterns 17a, 17b are provided to sandwich the Hall element 21, but only one coil pattern may be provided.

In other words, the current detection device 1 may have at least one coil pattern.

While certain embodiments have been described, these embodiments have been presented by way of example only, and are not intended to limit the scope of the inventions. Indeed, the novel devices described herein may be embodied in a variety of other forms; furthermore, various omissions, substitutions and changes in the form of the devices described herein may be made without departing from the spirit of the inventions. The accompanying claims and their equivalents are intended to cover such forms or modifications as would fall within the scope and spirit of the inventions.

What is claimed is:

1. A current detection device comprising:
a plane-shaped first coil pattern having a winding number of at least two or more;
a magnetic field detection element isolated from the first coil pattern in a direction orthogonal to a plane of the first coil pattern, and arranged to receive a magnetic field formed by the first coil pattern;
a driving circuit configured to drive the magnetic field detection element and output an output signal;
a second coil pattern;
a first substrate on the first coil pattern;
a second substrate on the second coil pattern; and
a third substrate on the magnetic field detection element,
wherein the magnetic field detection element is provided between the first coil pattern and the second coil pattern.

2. The current detection device according to claim 1, further comprising:
an insulation layer; and
a wiring pattern provided on the insulation layer,
wherein an end on a center side of the first coil pattern is electrically connected to the wiring pattern via a conductor provided in a contact hole in the insulation layer.

3. The current detection device according to claim 1, wherein a first face of the first substrate on which the first coil pattern is formed, and a second face of the second substrate on which the second coil pattern is formed, are arranged opposite and parallel to each other.

4. The current detection device according to claim 3, wherein the first coil pattern and the second coil pattern are electrically connected to each other such that a first magnetic flux direction when a current flows through the first coil pattern coincides with a second magnetic flux direction when the current flows through the second coil pattern.

5. The current detection device according to claim 1, wherein at least one of a distance between patterns and pattern width of the first coil pattern is constant.

6. The current detection device according to claim 1, wherein the magnetic field detection element is a Hall element.

7. The current detection device according to claim 6, wherein the output signal of the driving circuit includes a voltage value according to an electromotive force generated on the Hall element.

8. The current detection device according to claim 1, wherein the driving circuit is formed on the third substrate.

9. The current detection device according to claim 1, wherein shield layers are provided on both faces of the third substrate.

* * * * *